United States Patent
Nakayama

(10) Patent No.: US 6,774,500 B1
(45) Date of Patent: Aug. 10, 2004

(54) SUBSTRATE FOR SEMICONDUCTOR DEVICE, SEMICONDUCTOR CHIP MOUNTING SUBSTRATE, SEMICONDUCTOR DEVICE AND METHOD OF FABRICATION THEREOF, AND CIRCUIT BOARD, TOGETHER WITH ELECTRONIC EQUIPMENT

(75) Inventor: Toshinori Nakayama, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/626,146

(22) Filed: Jul. 26, 2000

(30) Foreign Application Priority Data

Jul. 28, 1999 (JP) .......................................... 11-213184
Jun. 9, 2000 (JP) ...................................... 2000-173294

(51) Int. Cl.[7] ............................................. H01L 23/29
(52) U.S. Cl. ........................ 257/788; 257/787; 257/792
(58) Field of Search ................................ 257/710, 736, 257/704, 787, 678, 788–795

(56) References Cited

U.S. PATENT DOCUMENTS

| | | | | |
|---|---|---|---|---|
| 4,263,341 A | * | 4/1981 | Martyniak | 427/448 |
| 5,153,379 A | * | 10/1992 | Guzuk et al. | 174/35 |
| 5,438,478 A | * | 8/1995 | Kondo et al. | 361/704 |
| 5,455,456 A | * | 10/1995 | Newman | 257/704 |
| 5,583,378 A | * | 12/1996 | Marrs et al. | 257/710 |
| 5,637,273 A | * | 6/1997 | Goo | 264/272.15 |
| 5,691,242 A | * | 11/1997 | Nomi et al. | 438/112 |
| 5,729,051 A | * | 3/1998 | Nakamura | 257/668 |
| 5,776,796 A | * | 7/1998 | Distefano et al. | 438/106 |
| 5,905,633 A | * | 5/1999 | Shim et al. | 361/704 |
| 6,037,698 A | * | 3/2000 | Ueda et al. | 310/313 R |
| 6,124,637 A | * | 9/2000 | Freyman et al. | 257/736 |
| 6,448,665 B1 | * | 9/2002 | Nakazawa et al. | 257/789 |

FOREIGN PATENT DOCUMENTS

JP            63-226053       *   9/1988   ........... H01L/23/52

* cited by examiner

Primary Examiner—Ori Nadav
(74) Attorney, Agent, or Firm—Oliff & Berridge, PLC

(57) ABSTRACT

A substrate for semiconductor device which is formed of a material that can be cut into separate pieces and has mounting regions for a plurality of semiconductor chips, and at least one hole is formed therein at a position of intersection between a plurality of cutting lines for cutting the substrate into a plurality of individual products.

11 Claims, 9 Drawing Sheets

US 6,774,500 B1

SUBSTRATE FOR SEMICONDUCTOR DEVICE, SEMICONDUCTOR CHIP MOUNTING SUBSTRATE, SEMICONDUCTOR DEVICE AND METHOD OF FABRICATION THEREOF, AND CIRCUIT BOARD, TOGETHER WITH ELECTRONIC EQUIPMENT

BACKGROUND OF THE INVENTION

1. Field of the Invention

The present invention relates to a substrate for a semiconductor device, a semiconductor chip mounting substrate, a semiconductor device and method of fabrication thereof, and a circuit board, together with electronic equipment.

2. Description of Related Art

Methods have been developed for providing small packages such as chip scale/size packages (CSPs), which involve mounting a plurality of semiconductor chips on a flexible substrate then sealing the entire assembly in resin. The resultant sealed product is then cut into individual packages.

If the flexible substrate is cut by a blade or router in this case, a problem occurs in that the cutting generates dust at the corner portions of individual products, so a better solution is required.

SUMMARY OF THE INVENTION

To solve this problem, the present invention provides a substrate for a semiconductor device, a semiconductor chip mounting substrate, a semiconductor device and method of fabrication thereof, and a circuit board, together with electronic equipment comprising the same, wherein the generation of cutting dust is reduced.

(1) According to a first aspect of the present invention, there is provided a substrate for a semiconductor device, having a mounting region for a semiconductor chip, wherein at least one hole is formed at a position where cutting lines intersect.

The substrate for a semiconductor device in accordance with this invention can be cut apart to separate it into individual products that are semiconductor devices. The cutting is done along cutting lines. In practice, the cutting lines are of a striped form having a certain width. Corner portions of individual products are formed at positions where the cutting lines intersect.

With this aspect of the invention, "hole" is not limited to a through hole; it can also refer to any other type of hole that does not penetrate, such as a depression. If a hole is formed at each position where cutting lines intersect, part of the substrate for the semiconductor device forms an indented shape at each corner portion of each individual product. If a depression is formed at each position where cutting lines intersect, part of the substrate for the semiconductor device is made thinner at each corner portion of each individual product.

Since parts of the substrate for the semiconductor device are either indented inward or is thinner at the corner portions of the individual products, it is therefore possible to reduce the amount of cutting dust when the cutting is done.

(2) In this substrate for a semiconductor device, one of the holes may be formed at the position where the cutting lines intersect; and the hole may be formed to a size that comprises an intersection portion of the cutting lines.

This ensures that the corner portions of individual products are defined by inner wall surfaces of the holes or thinner portions formed by the provision of the depressions. Part of the substrate for the semiconductor device is formed to be indented inward or thinner at each corner portion of each individual product.

(3) In this substrate for a semiconductor device, a plurality of the holes may be formed at the position where the cutting lines intersect; and part of each of the holes may be superimposed on an intersection portion between the cutting lines.

This ensures that the corner portions of individual products are defined by inner wall surfaces of the holes or thinner portions formed by the provision of the depressions. Part of the substrate for the semiconductor device can be formed to be indented inward or thinner at each corner portion of each individual product.

Moreover, since it is sufficient that part of each hole is superimposed on the intersection portion between the cutting lines, each hole can be made smaller.

(4) In this substrate for a semiconductor device, the plurality of holes may be positioned on edges of one of the cutting lines that is to be cut last, in the intersection portion.

(5) In this substrate for a semiconductor device, the plurality of holes may be formed on part of the cutting line that is to be cut last, when that part is to be cut earlier than the intersection portion between the cutting lines.

(6) In this substrate for a semiconductor device, the plurality of holes may be formed on part of the cutting line that is to be cut last, when that part is to be cut after the intersection portion between the cutting lines.

(7) In this substrate for a semiconductor device, the spacing between one of the holes formed on an edge of the cutting line that is to be cut last and another of the holes formed on another edge of the cutting line may be less than the thickness of a cutting portion of a cutting tool.

This configuration ensures that the cutting can be done to cut away a part of each hole and that the corner portions of individual products can be defined by inner wall surfaces of the holes or thinner portions formed by provision of the depressions.

(8) In this substrate for a semiconductor device, at least one of the holes may be formed; and the hole may have an aperture portion that is closed by a cover.

This makes it possible to prevent the sealing resin from flowing into the hole, and thus prevent the sealing resin from seeping from one surface of the semiconductor device to the other surface thereof through the hole.

(9) In this substrate for a semiconductor device, an interconnecting pattern may be formed; and the cover may be formed of the same material as the interconnecting pattern.

This makes it possible to form the cover without increasing the steps of the fabrication process.

(10) According to a second aspect of the present invention, there is provided a semiconductor chip mounting substrate, comprising: a substrate of a material that can be cut into separate pieces, in which is formed at least one hole at an intersection portion between cutting lines for separating the substrate into a plurality of individual products; and a plurality of semiconductor chips which are mounted on the substrate.

The substrate in accordance with this aspect of the invention, on which is mounted a plurality of semiconductor chips, can be cut apart to form a plurality of individual products. The cutting is done along the cutting lines. In practice, the cutting lines are of a striped form having a certain width. Corner portions of individual products of the substrate are formed at positions where the cutting lines intersect.

With this aspect of the invention, "hole" is not limited to a through hole; it can also refer to any other type of hole that does not penetrate, such as a depression. If a hole is formed at each position where cutting lines intersect, each corner portion of each individual product of the substrate forms an indented shape. If a depression is formed at each position where cutting lines intersect, each corner portion of each individual product of the substrate is made thinner.

Since the corner portions of individual pieces of the substrate are either indented inward or are thinner, it is possible to reduce the amount of cutting dust even when the cutting is done along the intersecting cutting lines.

(11) In this semiconductor chip mounting substrate, the plurality of semiconductor chips may be sealed in by resin.

This configuration makes it possible to cut the resin apart simultaneously with the cutting of the substrate.

(12) In this semiconductor chip mounting substrate, the resin may fill the hole.

This provides resin in the intersection portion between cutting lines. If holes are formed in the substrate, each corner portion of the individual pieces of substrate and resin is formed by resin. If depressions are formed in the substrate, each corner portion of the individual pieces of substrate and resin is formed by a thinner piece of substrate and the resin.

(13) In this semiconductor chip mounting substrate, the hole may be formed to a size that comprises the intersection portion of the cutting lines.

(14) In this semiconductor chip mounting substrate, the hole may have an aperture portion that is closed by a cover, and the resin may be provided over a surface of the substrate for a semiconductor device where the cover is provided.

This makes it possible to prevent the resin from flowing into the hole and thus prevent seepage of the resin from one surface of the substrate to the other surface thereof through the hole.

(15) According to a third aspect of the present invention, there is provided a semiconductor device comprising:
 a semiconductor chip;
 a substrate on which the semiconductor chip is mounted and which is formed by cutting apart a larger substrate; and
 resin for sealing the semiconductor chip;
 wherein the semiconductor device has an outer shape having a corner portion; and
 wherein a part of the substrate is indented further inward than an edge surface of the resin at the corner portion.

This aspect of the invention provides a configuration that reduces the amount of cutting dust that remains on the substrate after being generated at the corner portions by the cutting apart of the substrate.

(16) In this semiconductor device, the substrate at the corner portion may form a shape that is indented in the opposite direction from the direction in which the corner portion protrudes, and thus an edge surface of the substrate may be indented further inward than the edge surface of the resin.

(17) In this semiconductor device, the formation of a thinner portion in the substrate at the corner portion may ensure that a surface of the thinner portion of the substrate is indented further inward than the edge surface of the resin.

(18) In this semiconductor device, the part of the substrate that is indented further inward than the edge portion of the resin at the corner portion may be covered by the resin.

This ensures that part of the substrate is covered by resin at the corner portion so that no cutting dust is generated by the cutting apart of the substrate.

(19) In this semiconductor device, a cover may be provided at the corner portion, between the substrate and the resin; and the part of the substrate that is indented further inward than the edge surface of the resin may be exposed.

(20) According to a fourth aspect of the present invention, there is provided a circuit board which has any of the previously described semiconductor devices mounted thereon.

(21) According to a fifth aspect of the present invention, there is provided electronic equipment which is provided with any of the previously described semiconductor devices.

(22) According to a sixth aspect of the present invention, there is provided a method of fabricating a semiconductor device, the method comprising:
 a first step of mounting a plurality of semiconductor chips on a substrate on which is formed at least one hole at a position where cutting lines intersect, then sealing the plurality of semiconductor chips with resin; and
 a second step of cutting the substrate and the resin into individual products along the cutting lines, through at least part of the hole.

With this aspect of the invention, the substrate on which a plurality of semiconductor chips is mounted is cut apart to form a plurality of individual products. The cutting is done along cutting lines. In practice, the cutting lines are of a striped form having a certain width. Corner portions of individual pieces of the substrate and resin are formed at positions where the cutting lines intersect.

With this aspect of the invention, "hole" is not limited to a through hole; it can also refer to any other type of hole that does not penetrate, such as a depression. If a hole is formed at each position where cutting lines intersect, part of the substrate for the semiconductor device forms an indented shape at each corner portion of each individual piece of the substrate and resin. If a depression is formed at each position where cutting lines intersect, part of the substrate for the semiconductor device is made thinner at each corner portion of each individual piece of the substrate and resin.

Since the part of the substrate is either indented inward or is thinner at each corner portion of each individual piece of the substrate and resin, it is possible to reduce the amount of cutting dust when the cutting is done along the intersecting cutting lines.

(23) In this method of fabricating a semiconductor device, the resin may fill the hole in the first step.

This ensures that resin is provided at the each intersection portion of the cutting lines. If holes are formed in the substrate, each corner portion of the individual pieces of the substrate and resin is formed by resin. If depressions are formed in the substrate, each corner portion of the individual pieces of the substrate and resin is formed by a thinner piece of the substrate and resin.

(24) In this method of fabricating a semiconductor device, at least one of the holes may be formed in the substrate; a cover may be provided to block the hole, before the first step; and flow of the resin into the hole during the first step may be prevented by the cover.

This makes it possible to prevent the resin from flowing into the hole and thus prevent seepage of the resin from one surface of the substrate to the other surface thereof through the hole.

(25) The method of fabricating a semiconductor device may further comprise a step of forming an interconnecting pattern in the substrate, before the first step, and the cover may be formed during the step of forming the interconnecting pattern.

This makes it possible to provide a cover without increasing the number of fabrication steps.

(26) In this method of fabricating a semiconductor device, one of the holes may be formed at the position where the cutting lines intersect; and the substrate and the resin may be cut through an inner side of the hole in the second step.

This makes it possible to define the corner portions of individual pieces of the substrate with inner wall surfaces of the holes or thinner portions formed by the provision of the depressions.

(27) In this method of fabricating a semiconductor device, a plurality of the holes may be formed at the position where the cutting lines intersect; the plurality of holes may be formed to be positioned on edges of one of the cutting lines that is to be cut last, at the position where the cutting lines intersect; and the substrate and the resin may be cut through part of the respective holes in the second step.

This makes it possible to define the corner portions of individual products of the substrate with inner wall surfaces of the holes or thinner portions formed by the provision of the depressions. Moreover, since it is sufficient that part of each hole is superimposed on the intersection portion between the cutting lines, each hole can be made smaller.

(28) In this method of fabricating a semiconductor device, the substrate and the resin may be cut by a cutting tool having a thickness that is greater than the spacing between one of the holes formed on an edge of the cutting line that is to be cut last and another of the holes formed on another edge of the cutting line.

This configuration ensures that the cutting is done to cut away part of each hole and that the corner portions of individual products of the substrate are defined with inner wall surfaces of the holes or thinner portions formed by provision of the depressions.

DETAILED DESCRIPTION OF PREFERRED EMBODIMENTS

Embodiments of the present invention are described below with reference to the accompanying drawings.

First Embodiment

Figure 1:
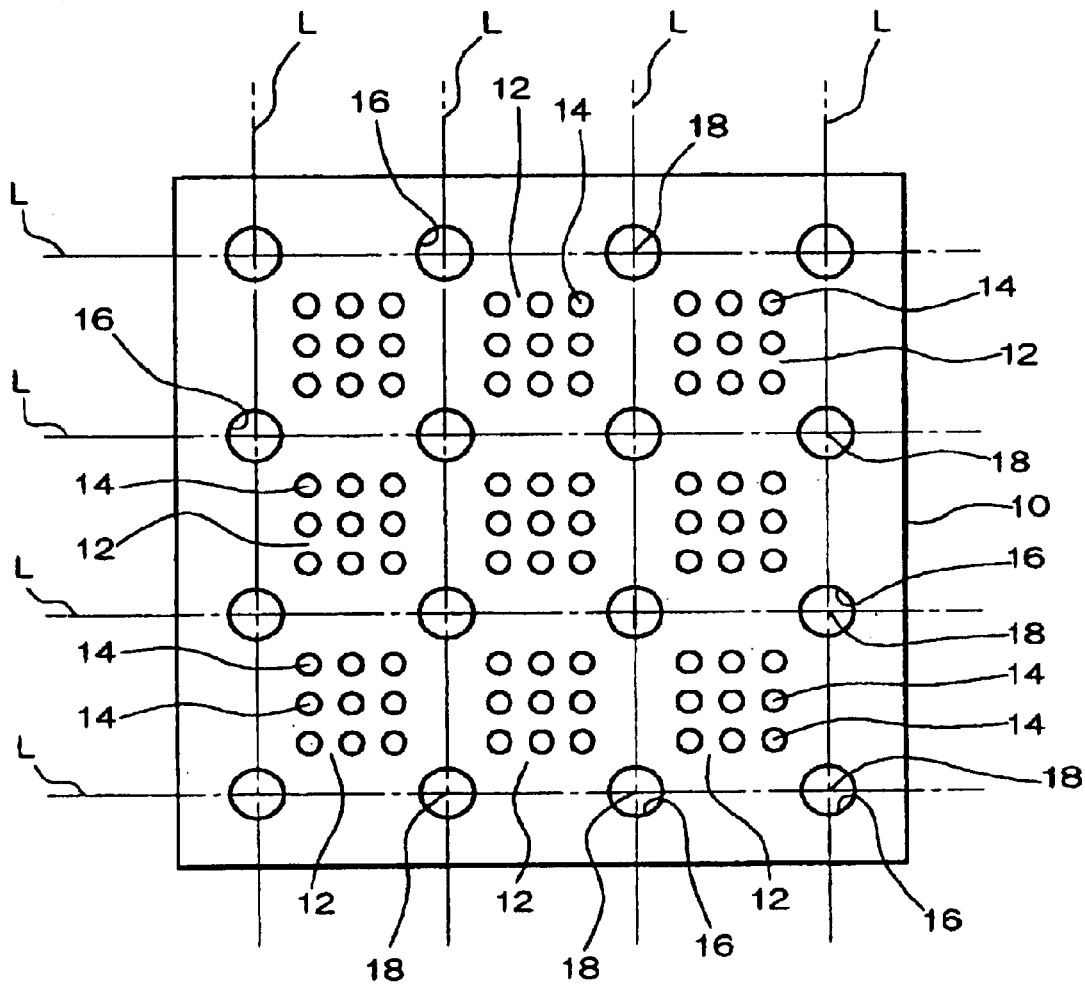
FIG. 1 shows a substrate for a semiconductor device in accordance with a first embodiment to which this invention is applied.
Figure 2:
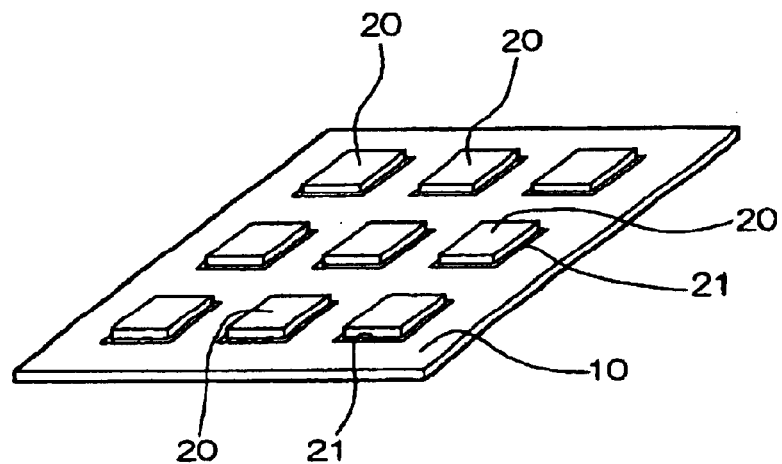
FIG. 2 shows a method of fabricating a semiconductor device in accordance with the first embodiment to which this invention is applied.

A substrate for a semiconductor device in accordance with a first embodiment to which this invention is applied is shown in FIG. 1. After a plurality of semiconductor chips 20 has been mounted on a substrate for a semiconductor device (hereinafter called "substrate") 10, as shown in FIG. 2, the assembly is cut into a plurality of individual products to form a plurality of semiconductor devices 30 (see FIG. 8). The substrate 10 becomes an interposer for the semiconductor devices when they are separated.

The substrate 10 is formed from a material that can be cut into separate pieces. The present invention is particularly effective when corner portions are formed by the cutting, and when the substrate 10 has been formed of a material that readily generates cutting dust at those corner portions. It is preferable to apply the present invention when the substrate 10 is formed of a material that is elastic, by way of example. The material of the substrate 10 could be any of various inorganic materials or materials including inorganic substance, but it is preferable to use an organic material therefor. An example of the substrate 10 formed from an organic material is a flexible substrate consisting of a polyimide resin.

At least one mounting region 12 is provided on the substrate 10, for mounting the plurality of semiconductor chips 20 (a plurality of mounting regions 12 is shown in FIG. 1, but it could equally well be one). An interconnecting pattern 13 (see FIG. 8) could also be formed in at least one surface of each mounting region 12 (in most cases, only one surface is used therefor, but both surfaces could also be used). A plurality of through holes 14 could be formed in the substrate 10, to enable electrical contact between one surface and the other surface. The plurality of through holes 14 could be formed in each mounting region 12. Inner wall surfaces of the through holes 14 could be plated with a conductive material such as copper or gold, or the through holes 14 could be filled with a conductive material. A component such as a solder bail to form an external terminal could be formed on top of each of the through holes 14.

At least one hole 16 is formed in the substrate 10, separate from the through holes 14. More specifically, at least one hole 16 is formed at each position where cutting lines L intersect (there is only one hole for each intersection in FIG. 1). The shape of this hole 16 is not limited; it could be a round hole or a square hole. The size of the hole 16 (its diameter if it is a round hole) is greater than the width of the cutting lines L, in other words, the thickness of the blade of a cutting tool. If the thickness of the blade of the cutting tool is 100 μm to 300 μm (generally 100 μm to 200 μm, but preferably on the order of 150 μm), by way of example, it is preferable that the diameter of the hole 16 is 150 μm to 500 μm, taking into account positioning errors of the cutting lines L of 50 μm to 200 μm.

The cutting lines L indicate positions where the substrate 10 is to be severed and are set at positions that delimit the plurality of individual products to be obtained from the substrate 10. In the example shown in FIG. 1, the plurality of cutting lines L is divided into a first group consisting of a plurality of parallel cutting lines L and a second group of a plurality of cutting lines L that extend perpendicular to the cutting lines L of the first group.

Since the cutting lines L indicate regions of the substrate 10 that will be separated while being cut at a predetermined width, they form stripes of a predetermined width in practice. The cutting lines L have a width that is the thickness of the blade of the cutting tool. Therefore, each intersection portion 18 between the cutting lines L is actually a region having a predetermined area, not a point.

Each hole 16 is formed to a size that comprises the corresponding intersection portion 18 between a plurality of cutting lines L therein, in other words, is formed to be larger than the intersection portion 18. If each intersection portion 18 is positioned completely within the corresponding hole 16, the corner portions of individual pieces of the substrate 10 are not defined by the intersection portions 18. The corner portions of each individual piece of the substrate 10 are defined by the inner wall surfaces of the corresponding holes 16. When the substrate 10 is cut into a plurality of individual products, therefore, no cutting dust is generated at the corner portions of the individual products.

With this embodiment of the invention, the peripheral edge portions of the substrate 10 are cut away, then the plurality of individual products is formed from the interior region. If it does not matter whether cutting dust is generated at the peripheral edge portions that are to be discarded, part of each relevant intersection portion 18 could protrude from the corresponding hole 16 in the direction of that peripheral edge portion. In such a case, the corner portions of the individual pieces of the substrate 10 are defined by the inner wall surfaces of the holes 16, as described above, but the corner portions of the peripheral edge portions that are to be discarded are formed by intersecting cut and thus it is inevitable that cutting dust will be generated.

The substrate for a semiconductor device in accordance with this embodiment has the above configuration and a semiconductor device using this substrate is fabricated by the method described below. The method of fabricating a semiconductor device comprises a semiconductor chip mounting substrate fabrication process (first step) and a semiconductor chip mounting substrate cutting process (second step).

Semiconductor Chip Mounting Substrate Fabrication Process

The process of fabricating the semiconductor chip mounting substrate is shown in FIGS. 2 to 4A. A plurality of semiconductor chips 20 will be mounted on the substrate 10, each in one of the plurality of mounting regions 12, as shown in FIG. 2. In this embodiment of the invention, the semiconductor chips 20 will be bonded so that the terminals thereof turn upward (face-up bonding). The semiconductor chips 20 could be bonded to the substrate 10 by an adhesive 21 or the like. The interconnecting pattern 13 (see FIG. 8) is formed on the substrate 10. The semiconductor chips 20 could be mounted on the surface on which the interconnecting pattern 13 is formed, and a plurality of external terminals 26 could be formed on the surface on the opposite side, via the through holes 14, by a process that will be described later.

Figure 3:
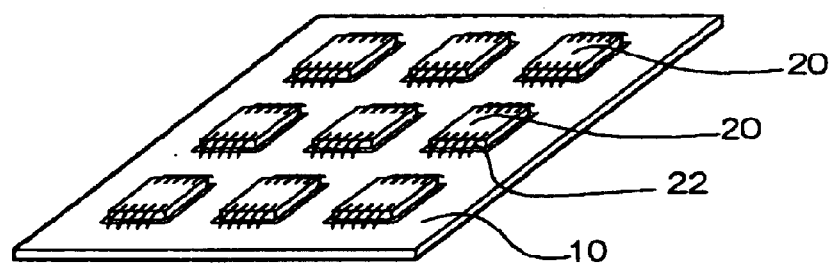
FIG. 3 shows more the method of fabricating a semiconductor device in accordance with the first embodiment to which this invention is applied.

The semiconductor chips 20 and the interconnecting pattern 13 are then connected electrically. In FIG. 3, they are shown connected together by wires 22, by way of example. Alternatively, the semiconductor chips 20 could be mounted on the substrate 10 by face-down bonding, in contrast to the orientation of this embodiment. In such a case, the electrical connections could be done by using an anisotropic conductive material, solder, conductive paste, or the like, or ultrasonic waves could be used to apply a metal bond. Heat or pressure could be added to the ultrasonic waves.

Figure 4A:
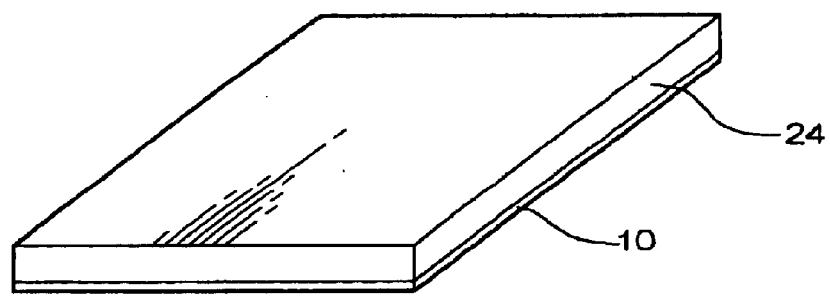
FIGS. 4A and 4B show still more of the method of fabricating a semiconductor device in accordance with the first embodiment to which this invention is applied.
Figure 4B:
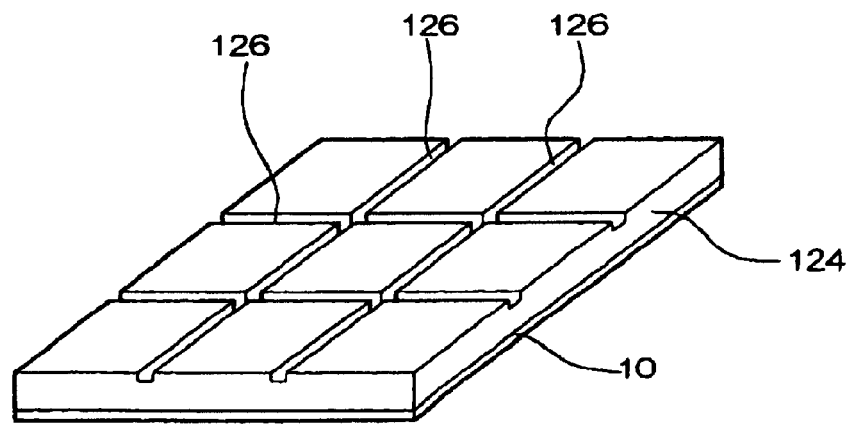

The plurality of semiconductor chips 20 is then sealed in with resin 24 (by batch sealing, for example), as shown in FIG. 4A. The entire substrate 10 could be sealed in by the resin 24. A metal die could be used for this sealing, in which case the resin 24 could be called molding resin. Alternatively, the resin 24 could be provided on top of the substrate 10 then spread evenly by a squeegee, or by potting. The surface of the resin 24 provided on top of the substrate 10 could be either flat or uneven. In a variant shown in FIG. 4B by way of example, grooves 126 could be formed in resin 124. If the grooves 126 are formed along the cutting lines L, this would facilitate the positioning for the cutting.

If the interconnecting pattern 13 is formed on the surface of the substrate 10 on which the semiconductor chips 20 are mounted, the interconnecting pattern 13 is covered and protected by the resin 24. The resin 24 could also fill all the holes 16 formed in the substrate 10.

The semiconductor chip mounting substrate shown in FIG. 4A is obtained by the above steps. The semiconductor chip mounting substrate is an intermediate product in the fabrication of a plurality of semiconductor devices, with the plurality of semiconductor chips 20 incorporated therein. The plurality of semiconductor chips 20 are sealed in by the resin 24. Details of the substrate 10 of the semiconductor chip mounting substrate are as described previously. The holes 16 of the substrate 10 could be filled with the resin 24.

Figure 5:
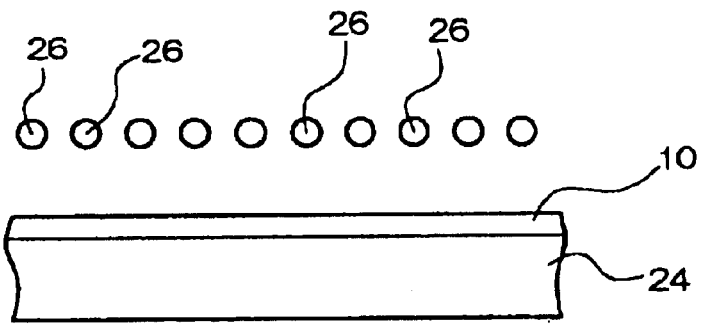
FIG. 5 shows even more of the method of fabricating a semiconductor device in accordance with the first embodiment to which this invention is applied.

Before the semiconductor chip mounting substrate is cut apart, a plurality of external terminals 26 could be provided thereon, as shown in FIG. 5. At this point, it is possible to provide the external terminals 26 simultaneously for a plurality of semiconductor devices. The external terminals 26 could be solder balls. The external terminals 26 could be provided on land portions formed on the substrate 10. If the interconnecting pattern 13 is formed on the surface on which the resin 24 is provided, electrical connection between the external terminals 26 and the interconnecting pattern 13 can be obtained either by solder or other conductive material that is provided within the through holes 14 or by the through holes 14 having inner surfaces plated with copper or other conductive material.

Semiconductor Chip Mounting Substrate Cutting Process

Figure 6:
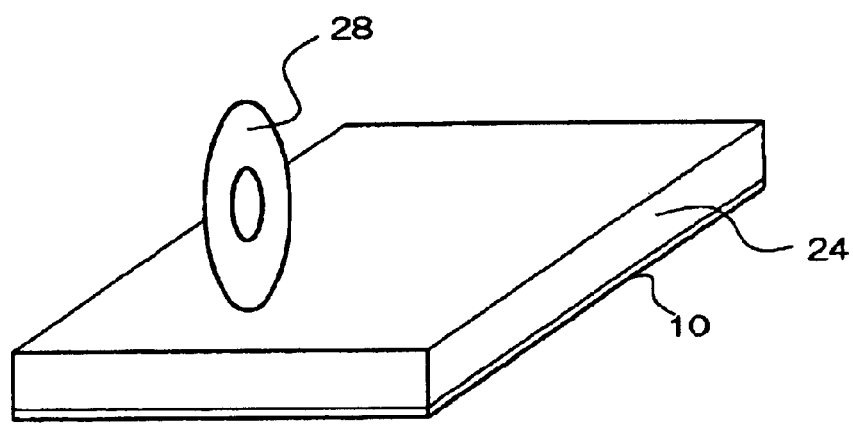
FIG. 6 shows yet more of the method of fabricating a semiconductor device in accordance with the first embodiment to which this invention is applied.

The semiconductor chip mounting substrate comprising the substrate 10, the plurality of semiconductor chips 20, and the resin 24 is then cut into separate products, as shown in FIG. 6. A cutting tool such as a blade 28 that is used for slicing silicon wafers could be used for this cutting into separate products. The cutting tool, such as the blade 28, is moved relative to the substrate 10 to cut apart the substrate 10. Either the blade 28 could be moved or the substrate 10 could be moved. The positions of the cutting is on the cutting lines L shown in FIG. 1. In other words, the substrate 10 and the resin 24 are cut apart through the inner sides of the holes 16, to obtain semiconductor devices 30 that are individual products. If the resin 24 has filled the holes 16, corner portions 32 are formed for each-semiconductor device 30 by the resin 24 (see FIG. 7). There is therefore no generation of cutting dust from the substrate 10.

Figure 7:
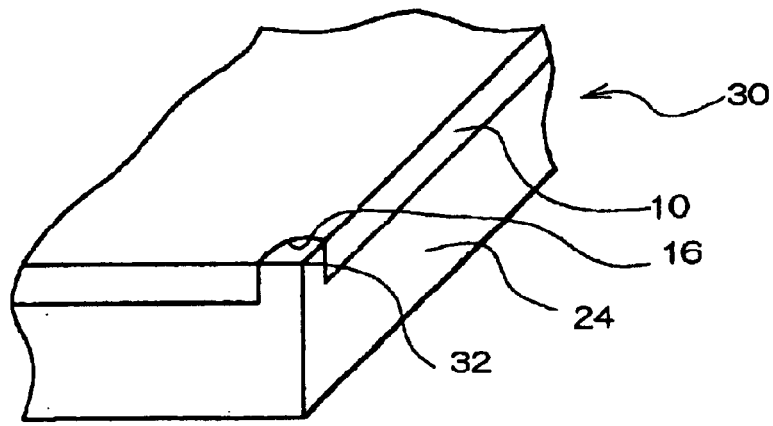
FIG. 7 shows a semiconductor device in accordance with the first embodiment to which this invention is applied.

A cross section of the substrate 10 and the resin 24 is shown in FIG. 7. In the example shown in FIG. 7, part of the substrate 10 is indented further inward than the edge surface of the resin 24 at the corner portion 32 of the semiconductor device 30. As mentioned previously, each intersection portion 18 between cutting lines L is positioned within one of the holes 16 of the substrate 10, so that the corner portions of the substrate 10 are defined by inner wall surfaces of the holes 16. The inner wall surface of each of the holes 16 of the substrate 10 therefore forms a shape that is indented in the opposite direction to the direction in which the corner portion 32 protrudes, at the corner portion 32 of each semiconductor device 30. Since the resin 24 fills the holes 16 in the substrate 10 during the process of fabricating the semiconductor chip mounting substrate, the inner wall surfaces of the holes 16 are covered with the resin 24.

Figure 8:
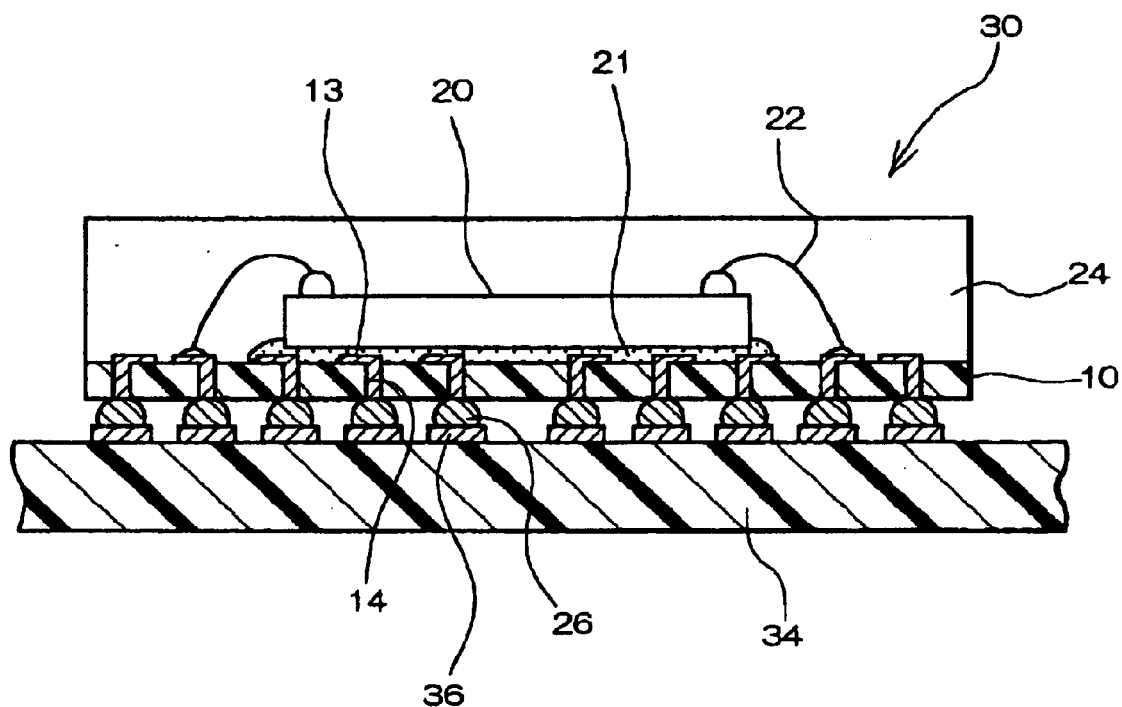
FIG. 8 is another view of the semiconductor device in accordance with the first embodiment to which this invention is applied.

The semiconductor device 30 in accordance with this embodiment of the invention is shown in FIG. 8. This semiconductor device 30 comprises the semiconductor chip 20, an individual piece of the substrate 10 on which the semiconductor chip 20 was mounted and which was formed by cutting a larger substrate apart, and an individual piece of the resin 24 which seals the semiconductor chip 20 and which was formed by cutting a larger piece of resin apart. All other characteristics of this embodiment are as previously described.

The semiconductor device 30 of FIG. 8 is mounted on a circuit board 34. In general, this circuit board 34 would have an organic substrate, such as a glass epoxy substrate by way of example. An interconnecting pattern 36 is then formed on the circuit board 34 of a material such as copper, to create desired circuitry, and this wiring pattern 36 and the external terminals 26 of the semiconductor device 30 are connected together to make them electrically conductive.

Second Embodiment

Figure 9:
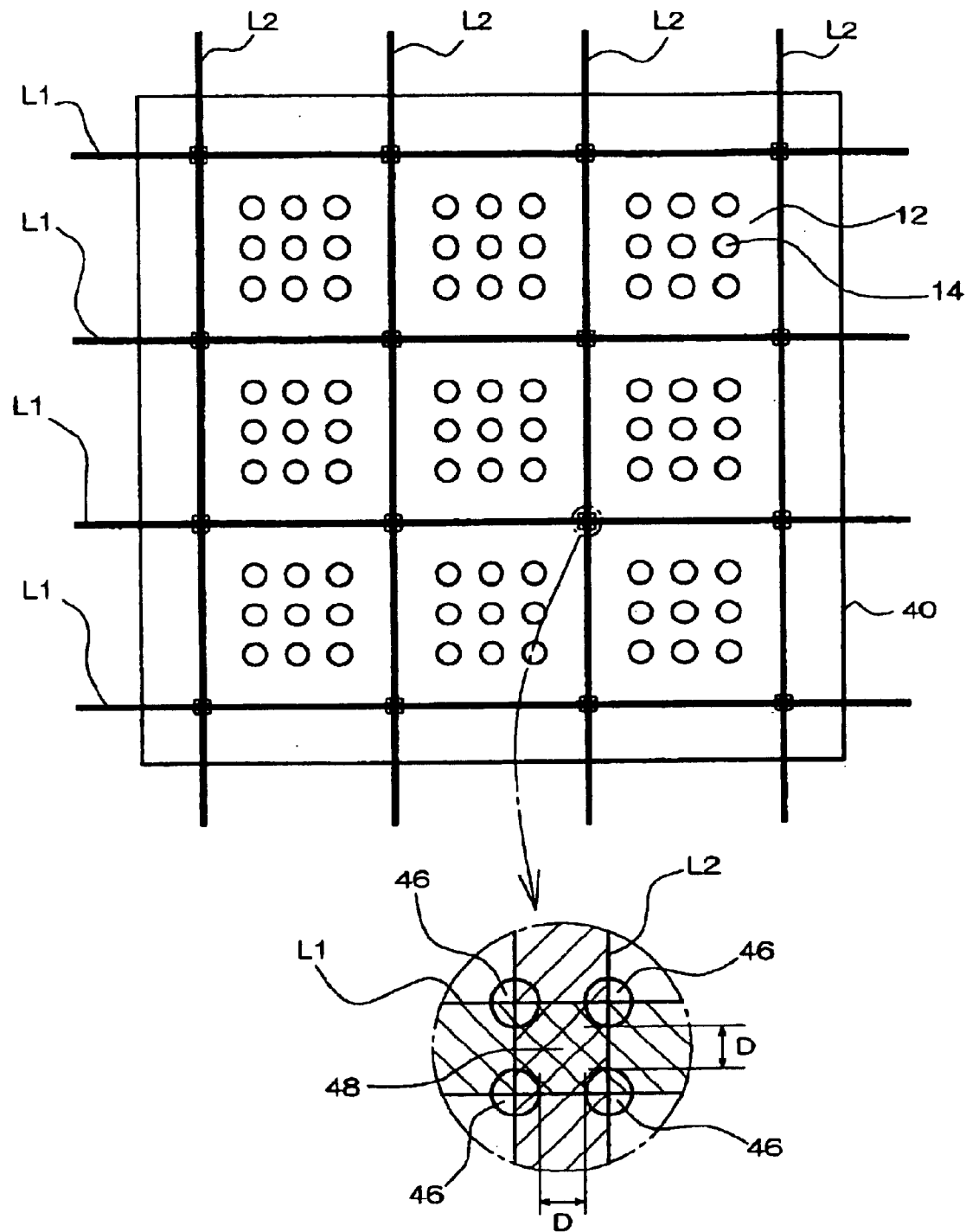
FIG. 9 shows a substrate for a semiconductor device in accordance with a second embodiment to which this invention is applied.

A substrate for a semiconductor device in accordance with a second embodiment to which this invention is applied is shown in FIG. 9. A plurality of holes 46 is formed in a substrate for a semiconductor device (hereinafter called "substrate") 40, as shown in FIG. 9. The substrate 40 could have the same configuration as the substrate 10 of FIG. 1, apart from the holes 16.

Figure 10:
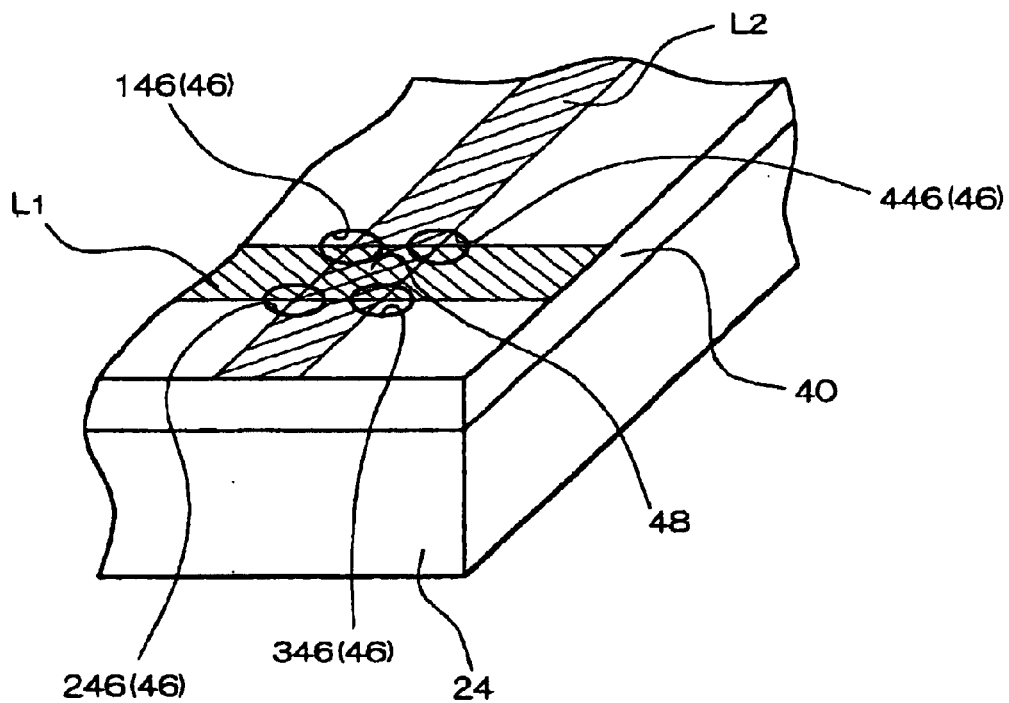
FIG. 10 shows a method of fabricating a semiconductor device in accordance with the second embodiment to which this invention is applied.

In this embodiment of the invention a plurality of holes 46 are formed at positions where the pluralities of cutting lines $L_1$ and $L_2$ intersect. The cutting lines $L_1$ and the cutting lines $L_2$ intersect at right angles. The cutting lines $L_1$ and $L_2$ are the same as the cutting lines L of the first embodiment. Therefore, the cutting lines $L_1$ and $L_2$ form stripes of a predetermined width, as shown in FIG. 10. Part of the respective hole 46 overlap an intersection portion 48 between the cutting lines $L_1$ and $L_2$.

In this embodiment of the invention, a plurality of the holes 46 is formed to be positioned on the edges of the cutting line $L_1$ or the cutting line $L_2$. In addition, corner portions of the intersection portions 48 of the cutting lines $L_1$ and $L_2$ overlap the corresponding holes 46.

The spacing D between each pair of the holes 46 that are positioned on the edges of the cutting lines $L_1$ or $L_2$ is preferably less than the width of the cutting lines $L_1$ and $L_2$, in other words, less than the thickness of the cutting tool (for example, the blade 28), as shown in the enlargement of FIG. 9. If the thickness of the blade of the cutting tool is 100 $\mu$m to 300 $\mu$m (generally 100 $\mu$m to 200 $\mu$m, but preferably on the order of 150 $\mu$m), by way of example, the spacing D is preferably less than that. The diameter of the holes 46 is sufficient to allow for positioning error in the cutting lines $L_1$ and $L_2$, that is on the order of 50 $\mu$m to 200 $\mu$m, for example. With this embodiment of the invention, the diameter of the holes 46 can be made smaller than in the first embodiment. As a result, it is possible to reduce a state in which the resin incorporated into the holes 46 is forced out onto the surface of the substrate 40.

With this embodiment of the invention, the cutting of the plurality of intersecting cutting lines $L_1$ and $L_2$ is done first along the cutting lines $L_1$, and subsequently (finally) along the cutting lines $L_2$. The cutting that is done last generates cutting dust at the corner portions of individual parts of the substrate 40, so it is preferable that the hole 146 of FIG. 10 is positioned at at least a corner portion of an individual product. When the plurality of individual products is to be formed from all other regions excluding the peripheral edge portions of the substrate 40, it is not always necessary to have holes 246, 346, and 466 that are positioned at the corner portions within the excluded peripheral edge portions.

Similarly, the holes 46 are sufficient to be positioned on the edges of the cutting line $L_2$ for the final cutting, when the corner portions of a plurality of individual products are to be formed by the plurality of intersecting cutting lines $L_1$ and $L_2$.

Figure 11A:
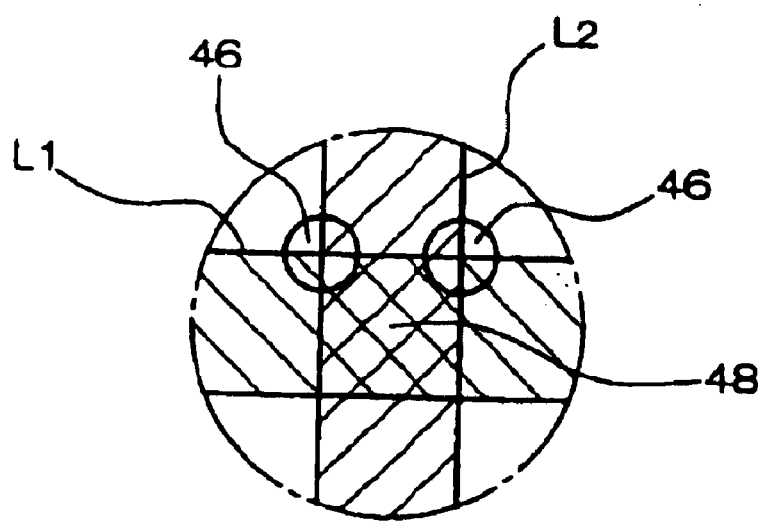
FIGS. 11A and 11B show a modification of the substrate for a semiconductor device in accordance with the second embodiment to which this invention is applied.
Figure 11B:
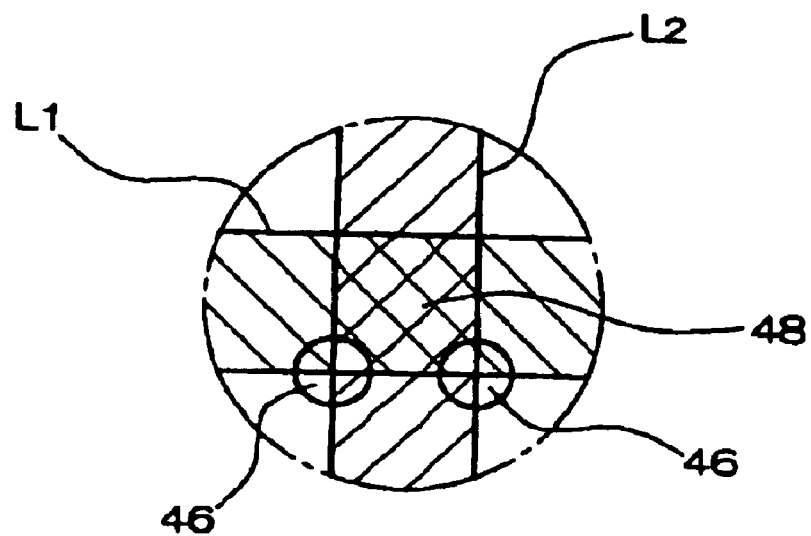

A modification of this embodiment of the invention is shown in FIGS. 11A and 11B, with the cutting being performed along the cutting line $L_2$ from the top of each diagram to the bottom.

If cutting dust is to be generated at part of the cutting line $L_2$ that is cut by the final cutting and that part is cut earlier than the intersection portion 48, the holes 46 are formed as shown in FIG. 11A. In other words, the holes 46 could be formed on the cutting line $L_2$ only at the part that is cut earlier than the intersection, portion 48. In that case, it is originally difficult for cutting dust to occur at another part of the cutting line $L_2$ that is cut after the intersection portion 48.

Alternatively, if cutting dust is to be generated at part of the cutting line $L_2$ that is cut by the final cutting and that part is cut after the intersection portion 48, the holes 46 are formed as shown in FIG. 11B. In other words, the holes 46 could be formed on the cutting line $L_2$ only at the part that is cut after the intersection portion 48. In that case, it is originally difficult for cutting dust to occur at another part of the cutting line $L_2$ that is cut earlier than the intersection portion 48.

The conditions that determine on which part of the cutting line cutting dust is most likely to occur depend on the properties of the substrate 40 and the resin and the cutting method (such as the direction of rotation or direction of movement of the cutting tool and the surface of the substrate 40 that is touched by the cutting tool).

This embodiment of the invention has the configuration described above and details that were described with reference to the first embodiment can also be applied as far as possible thereto. In addition, details that were described with reference to the first embodiment can also be applied to a semiconductor chip mounting substrate that uses the substrate 40 in accordance with this embodiment of the invention, allowing for differences in the configuration of the substrate 40.

The method of fabricating a semiconductor device that uses the substrate 40 in accordance with this embodiment of the invention involves cutting the substrate 40 and the resin through part of each of the holes 46. A cutting tool that is thicker than the spacing D between each pair of holes 46 is used during the cutting step to cut through the substrate 40 and the resin. All other details that were described with reference to the first embodiment can be applied to this embodiment.

Third Embodiment

Figure 12A:
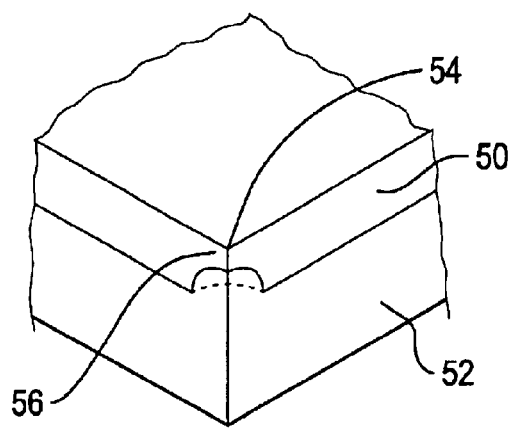
FIG. 12A shows a semiconductor device in accordance with a third embodiment to which this invention is applied.
Figure 12B:
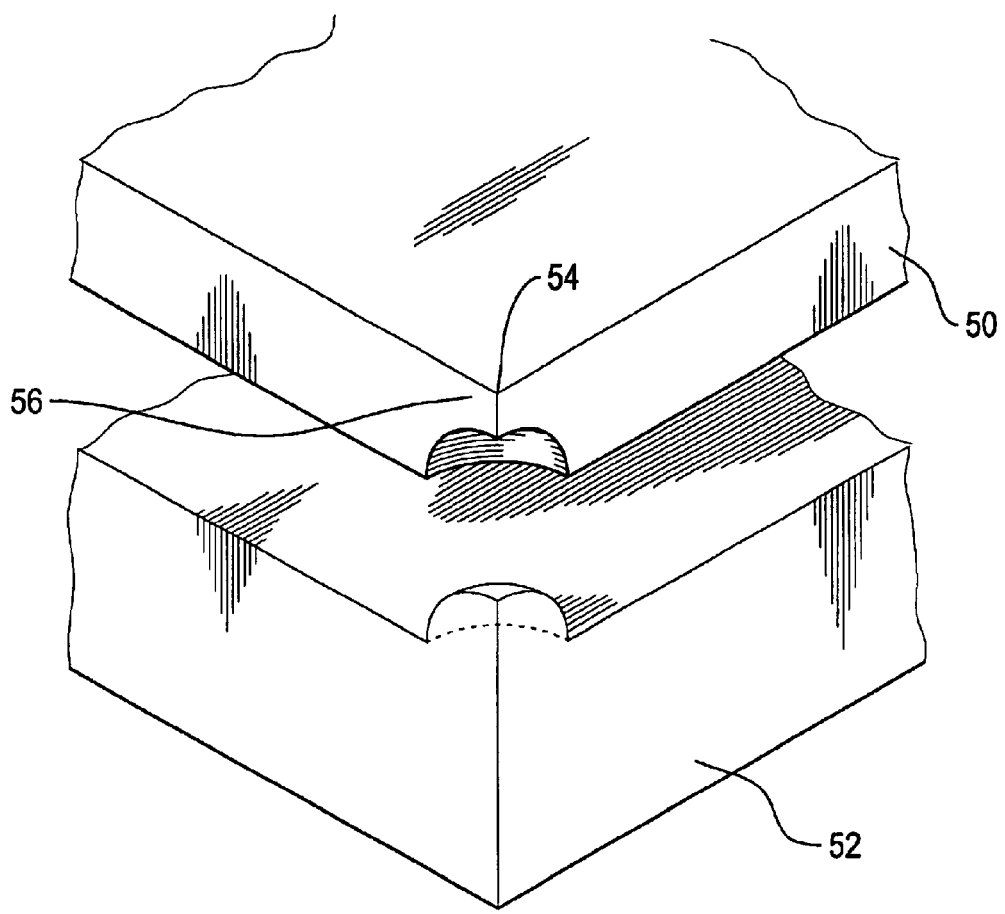
FIG. 12B shows the semiconductor device of FIG. 12A with the substrate and resin separated.

A semiconductor device in accordance with a third embodiment to which this invention is applied is shown in FIGS. 12A and 12B. The semiconductor device of FIGS. 12A and 12B comprises a substrate 50 that has formed individual products and resin 52 that seals a plurality of semiconductor chips that were mounted on the substrate 50. A thinner portion 56 is formed in the substrate 50 at each of corner portions 54 of the semiconductor device. The thinner portion 56 is formed as a depression in at least one of the upper and lower surfaces of the substrate 50. The thickness of the thinner portion 56 is preferably between approximately ⅓ and ¼ of the thickness of the substrate 50, by way of example. The size of the thinner portion 56 (or the diameter thereof, if circular) is preferably greater than the thickness of the cutting tool (when viewed from a direction perpendicular to the substrate 50). If the depression is placed facing into the resin 52, as shown in FIG. 12, the resin 52 could cover that depression. Alternatively, the depression could be on the opposite side from the resin 52. The formation of the thinner portion 56 ensures that the depression of the substrate 50 is indented further inward than the edge surfaces of the resin 52.

The individual pieces of the substrate 50 that are used by the semiconductor devices in accordance with this embodiment can be formed from substrates for semiconductor devices having mounting regions for a plurality of semiconductor chips. More specifically, the holes 16 or 46 of the substrate 10 or 40 of the first or second embodiment could be converted into depressions to give a structure that can be used as a substrate for semiconductor devices. In that case, the depressions are cut to form the previously described thinner portions 56.

Since depressions are formed instead of though-holes in the substrate for a semiconductor device in accordance with this embodiment of the invention, there is no seepage of resin provided on one face of the substrate to an opposing face of the substrate when resin is provided. This substrate for a semiconductor device could be used fabricate a semi-conductor chip mounting substrate. Semiconductor devices could be fabricated by cutting apart this semiconductor chip mounting substrate. The methods described above with reference to the previous embodiments can be applied thereto. Since the cutting is done though the depressions instead of through-holes, the cutting ends at portions that have become thinner, so there is little cutting dust.

Chemical half-etching could be used when forming the depressions of this substrate for semiconductor devices. In such a case, the depressions could be formed on either the surface provided with the resin or on the opposite side thereto. Alternatively, a substrate for a semiconductor device could be used to fabricate a conductor chip mounting substrate, then depressions are formed in a substrate for a semiconductor device that forms one part thereof. In such a case, the depressions are formed on the opposite side from the surface on which the resin has already been provided.

Fourth Embodiment

Figure 13:
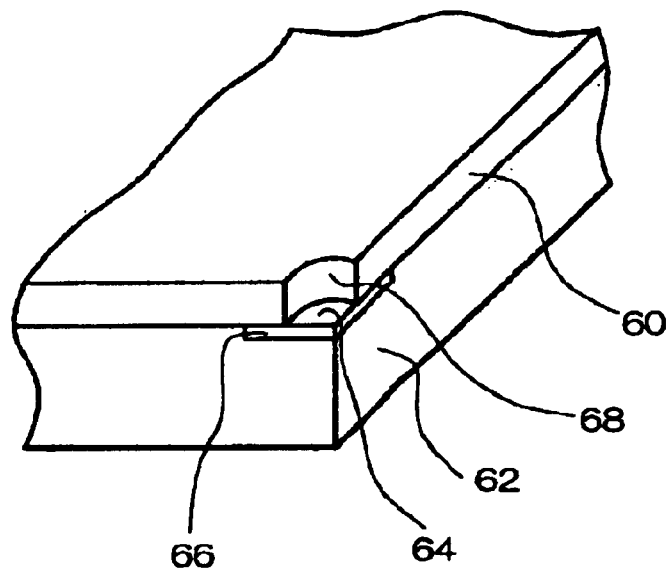
FIG. 13 shows a semiconductor device in accordance with a fourth embodiment to which this invention is applied.

A semiconductor device in accordance with a fourth embodiment of this invention will now be described, with reference to FIG. 13. The semiconductor device in accordance with this embodiment has the configuration of the semiconductor device described with reference to the first or second embodiment, but with the addition of a cover (or seal member, or shielding member) 66.

In other words, the cover 66 is provided between a substrate 60 and resin 62 at each corner portion 64 of the semiconductor device. An edge surface 68 that is formed to be indented in the opposite direction to the direction of protrusion of the corner portion 64 is exposed at the corner portion 64. The edge surface 68 is indented further inward than the edge surfaces of the resin 62. Note that a material such as a resin could be provided to cover the edge surface 68.

The semiconductor device in accordance with this embodiment of the invention could be configured by using a substrate for a semiconductor device wherein the aperture portion of each of the holes 16 or 46 of the substrate 10 or 40 of the first or second embodiment could be closed off by the cover 66. The material of the cover 66 could be a resin or a metal such as copper. The cover 66 could be formed of the same material as the interconnecting pattern (a conductive material such as copper), at the same time that the interconnecting pattern is formed on the substrate for the semiconductor device. If the cover 66 is made at the same time as the interconnecting pattern, there is no need to increase the number of fabrication steps. Alternatively, the cover 66 could be provided on the surface on the opposite side from the interconnecting pattern. Further alternatively, a liquid coating material could be poured into the holes 16 or 46 then solidified. Note if that the color of the cover 66 is different from the color of the substrate for the semiconductor device, the color of the cover 66 will be visible through the holes 16 or 46. In other words, the holes 16 or 46 can be identified by the color of the cover 66. Since the holes 16 or 46 are aligned along the cutting lines L, $L_1$, and $L_2$, this can be used to mark the cutting.

If the substrate for a semiconductor device in accordance with this embodiment is used and resin is provided over the surface on which the covers 66 are provided, the resin will not flow from the holes 16 or 46 and thus there will be no seepage to the opposite side.

All other details that were described with reference to the first and second embodiments can be applied to this embodiment.

Figure 14:
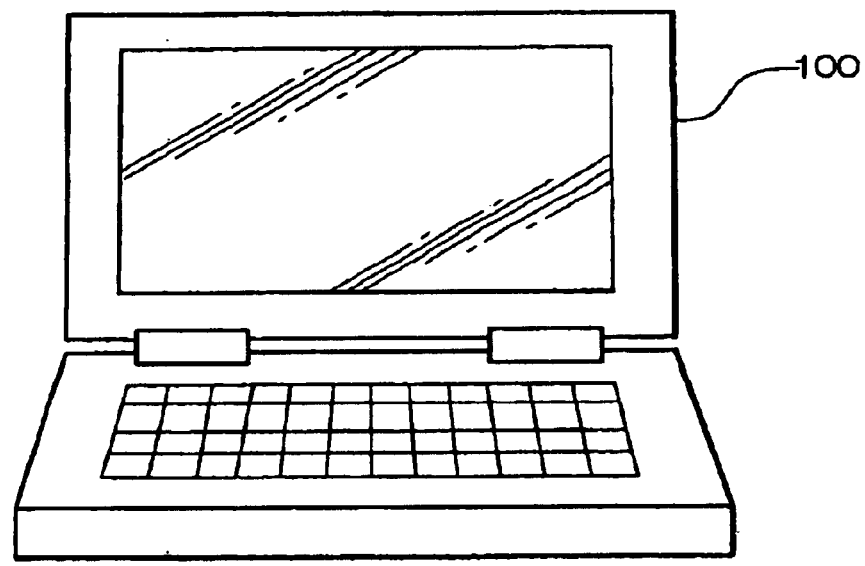
FIG. 14 shows electronic equipment that is provided with a semiconductor device fabricated by applying the method in accordance with this invention.

A notebook-sized personal computer 100 having a semiconductor device to which this invention is applied is shown in FIG. 14.

Note that the "semiconductor chip" that is a structural component of the present invention could be replaced by an "electronic element," and electronic elements (either active elements or passive elements) can be mounted on a substrate to fabricate an electronic component, in a manner similar to that of semiconductor chips. Examples of electronic components fabricated by using such electronic elements include optical elements, resistors, capacitors, coils, oscillators, filters, temperature sensors, thermistors, varistors, variable resistors, or fuses, by way of example.

What is claimed is:

1. A semiconductor device, comprising:
   a semiconductor chip;
   a substrate on which the semiconductor chip is mounted and which is formed by cutting apart a larger substrate; and resin for sealing the semiconductor chip, the semiconductor device has side surfaces, each of the side surfaces is flat, each of the side surfaces is made of at least an edge surface of the substrate and an edge surface of the resin, the edge surface of the substrate and the edge surface of the resin are aligned with each other, a pair of the side surfaces make a corner portion, and a hole is formed in the substrate such that the substrate is indented at the corner portion further inward than a portion of the resin.

2. The semiconductor device as defined in claim 1, the substrate at the corner portion forms a shape that is indented in the opposite direction from the direction in which the corner portion protrudes, and thus an indented surface of the substrate is positioned further inward than the portion of the resin.

3. The semiconductor device as defined in claim 1, an indented surface of the substrate is covered by the resin.

4. The semiconductor device as defined in claim 1, a cover is provided at the corner portion, between the substrate and the resin; and wherein an indented surface of the substrate is exposed.

5. A circuit board on which is mounted the semiconductor device as defined in claim 1.

6. Electronic equipment provided with the semiconductor device as defined in claim 1.

7. The semiconductor device as defined in claim 1, wherein the hole is a through-hole.

8. A semiconductor device, comprising:

a semiconductor chip;

a substrate on which the semiconductor chip is mounted and which is formed by cutting apart a larger substrate; and resin for sealing the semiconductor chip, the semiconductor device has side surfaces, each of the side surfaces is flat, each of the side surfaces is made of at least an edge surface of the substrate and an edge surface of the resin, a pair of the side surfaces make a corner portion, and the substrate has a thinner portion at the corner portion such that the thinner portion is formed as a depression in a surface of the substrate and the resin fits within the depression.

9. A semiconductor device, comprising:

a semiconductor chip;

a substrate on which the semiconductor chip is mounted and which is formed by cutting apart a larger substrate; and resin for sealing the semiconductor chip, the semiconductor device has side surfaces, each of the side surfaces is flat, each of the side surfaces is made of at least an edge surface of the substrate and an edge surface of the resin, a pair of the side surfaces make a corner portion, and a hole is formed in the substrate such that the substrate is indented at the corner portion further inward than a portion of the resin.

10. A semiconductor device having side surfaces, each of the side surfaces being flat, a pair of the side surfaces making a corner portion, the semiconductor device comprising:

a semiconductor chip;

resin for sealing the semiconductor chip, the resin having an edge surface; and a substrate on which the semiconductor chip is mounted, the substrate having such a shape as to be obtained by cutting apart a larger substrate across a hole formed in the larger substrate, the substrate having an indented surface at the corner portion further inward than a portion of the resin, the indented surface being a portion of an inner surface of the hole, one of the side surfaces is made of at least an outline surface of the substrate excluding the indented surface and the edge surface of the resin, the outline surface of the substrate and the edge surface of the resin are aligned with each other.

11. A semiconductor device, comprising:

a semiconductor chip;

a substrate on which the semiconductor chip is mounted and which is formed by cutting apart a larger substrate, the substrate having an outline surface defining a thickness of the substrate, the substrate having a thinner portion; and resin for sealing the semiconductor chip, the resin having an edge surface, the semiconductor device has side surfaces, each of the side surfaces is flat, one of the side surfaces is made of at least the outline surface of the substrate and the edge surface to the resin, the outline surface of the substrate and the edge surface of the resin are aligned with each other, a pair of the side surfaces make a corner portion, the substrate has the thinner portion at the corner portion such that the thinner portion is formed as a depression in a surface of the substrate and the resin fits within the depression.

* * * * *